Sept. 9, 1969 G. E. HOLZ 3,466,461

SEMICONDUCTOR DEVICE AND CIRCUIT FREE OF AVALANCHE OSCILLATIONS

Filed Dec. 20, 1966

INVENTOR

GEORGE E. HOLZ

BY Robert C. Green

ATTORNEY

United States Patent Office 3,466,461

Patented Sept. 9, 1969

3,466,461

SEMICONDUCTOR DEVICE AND CIRCUIT FREE OF AVALANCHE OSCILLATIONS

George E. Holz, North Plainfield, N.J., assignor to Burroughs Corporation, Detroit, Mich., a corporation of Michigan Filed Dec. 20, 1966, Ser. No. 603,306
Int. Cl. H03k *5/08*
U.S. Cl. 307—237 4 Claims

ABSTRACT OF THE DISCLOSURE

An integrated semiconductor device for operating while preventing avalanche oscillations comprising a body of semiconductor material having two identical transistors formed therein, each having emitter, base, and collector regions formed in the body of semiconductor material. The two emitter regions and the two collector regions are provided with a common ohmic contact which can be connected to external circuits, but only one base electrode is provided with such a contact. This device, when connected in a circuit, operates without the danger of avalanche oscillations occurring.

Figure 1:
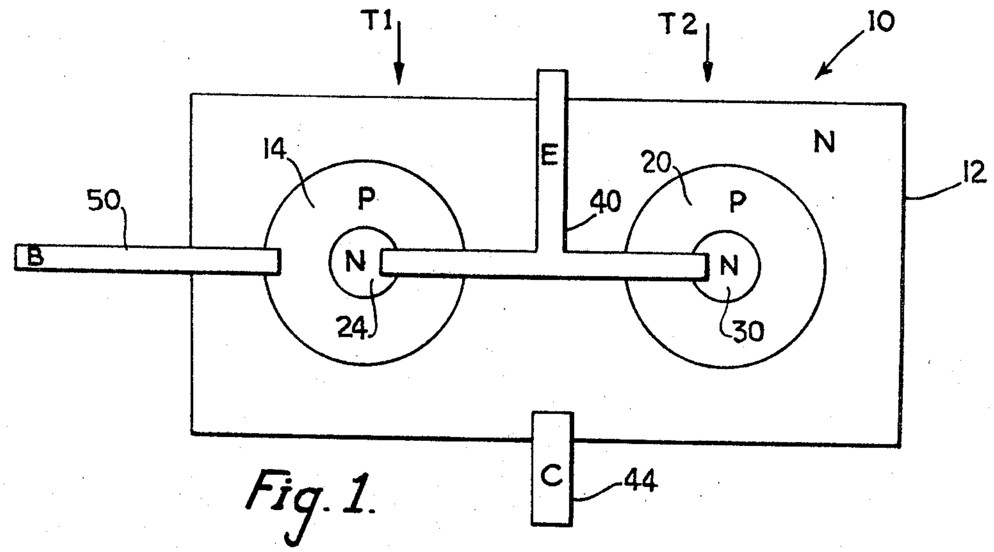

This invention relates to semiconductor devices and to circuits using semiconductor devices.

Under some conditions of operation, and these conditions are found in most transistor circuits, transistors suffer avalanche oscillations due to a negative resistance characteristic when the transistors are operated above their Vceo. Vceo is the voltage between the collector and the emitter with the base open. Such oscillations represent radio frequency interference and generally interfere with normal circuit operation. Avalanche oscillations can be prevented by using transistors whose Vceo is higher than the required output voltage. However, such transistors may be expensive, or they may be undesirable for some reason.

In another arrangement for solving the problem, the collector of a transistor is connected through a clamping diode to a suitable fixed bias voltage which prevents the transistor from rising above its Vceo voltage. This solution is undesirable because it requires an external power supply and because the polarity of the diode anode and the transistor collector are opposite. This complicates the construction of an integrated circuit of a transistor and its clamping diode.

The present invention provides a novel semiconductor device which is simple in construction and which inherently prevents avalanche oscillation. A semiconductor device embodying the invention comprises two transistors which may be conveniently prepared simultaneously by monolithic or integrated circuit processes and, as a result, are identical in structure and characteristics. Each transistor includes the usual base, emitter, and collector electrodes, and the collector and emitter electrodes are connected together to provide common terminals to these electrodes. One base electrode is provided with a terminal for connection to an external circuit, and the other base electrode remains unconnected. In a typical circuit in which the common emitter electrodes are connected to ground, the collector electrodes are connected to some utilization circuit, and the single base electrode is connected to a source of input signals. The transistor having its base unconnected breaks down in its Vceo mode and operates as a clamping diode. Thus, in effect, we have a Zener diode which breaks down at the Vceo of the transistor and automatically limits the operating voltage of the transistor and prevents avalanche oscillation.

Figure 2:
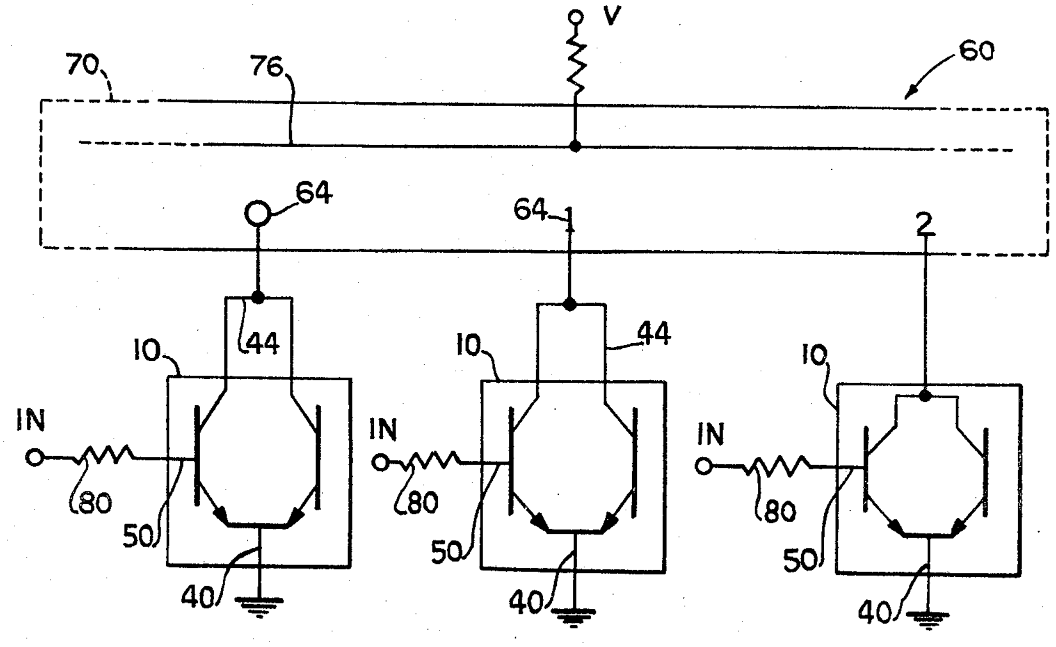

The invention is described in greater detail by reference to the drawing wherein:

FIG. 1 is a schematic representation of a semiconductor device embodying the invention; and FIG. 2 is a schematic circuit in which devices embodying the invention may be used.

The principles of the invention are applicable to all types of semiconductor devices, including those with three or four or more different zones of semiconductor material. At the present time, the problem solved by the invention is found most commonly in three-electrode NPN transistors, and, accordingly, NPN transistors are shown. The well-known conventions are also used to denote the usual base, emitter, and collector electrodes of the transistors. A device 10 embodying the invention, referring to FIG. 1, includes two transistors T1 and T2 which are preferably identical in characteristics and have their emitter electrodes connected together to a common terminal 40 and their collector electrodes connected together to a common terminal 44. The base electrode of one transistor is provided with a terminal 50 for making external connection thereto, and the other base electrode remains unconnected.

The device 10 shown in FIG. 1 can be made conveniently on a crystal 12 of germanium, silicon, or the like, of N type conductivity, which has a top surface in which zones 14 and 20 of P type material are first formed, and then zones of N type material 24 and 30 are formed within the zones of P type material. The different zones of semiconductor material may be formed in well-known fashion, for example, by diffusing suitable impurities through apertures in protective layers of silicon dioxide. After the desired operations are performed, the crystal essentially comprises two identical devices T1 and T2, each of which is a NPN transistor. The N type zones 24 and 30 are utilized as the emitter electrodes, and a common electrical connection 40 is provided between them. The orignal N type crystal comprises the common collector electrode for each transistor, and the desired interconnection is thus provided automatically. Thus, an ohmic contact 44 need only be made at a suitable location on the original crystal. The P type regions 14 and 20 are the bases of the transistors T1 and T2, and an ohmic connection 50 is made to one, and no connection is made to the other.

Devices 10 of the type shown in FIG. 1 may be used in many circuits. In one typical circuit 60 shown in FIG. 2, devices 10 are used to switch on the glow cathodes 64 of a type 6844A indicator tube 70 in response to input signals. In the circuit, the indicator tube 70 includes an anode electrode 76, which is connected through a suitable current-limiting resistor to a power supply, and a plurality of cathode electrodes 64, usually in the form of numerals, each of which is connected to the collector connection 44 of a device 10. The common emitter connection 40 is coupled to ground, and the single base connection 50 is coupled through a resistor 80 to a suitable source of input signals for turning on the device and causing its associated cathode to glow. Typically, the base electrodes 50 may be connected to the output lines of a decoder circuit (not shown).

In operation of the circuit 60, when a positive pulse appears at the base or input lead 50 of one of the devices 10, the device turns on and conducts current, and the cathode electrode 64, to which its collectors are connected, glows. In the circuit, the devices 10 operate with optimum stability and without avalanche oscillations.

What is claimed is:

1. An integrated semiconductor device adapted to prevent oscillations including a body of semiconductor material, a first semiconductor device formed in said body, a second semiconductor device formed in said body, said first and second devices having substantially identical configurations and characteristics and each including base, emitter, and collector regions of semiconductor material, said body comprising a common collector region for both transistors and including an ohmic contact for making external connection thereto, a common ohmic connection between said emitter regions for making external connection thereto, and an ohmic connection to one of said base regions and for making external connection thereto, the other base region having no ohmic connection so that it cannot be connected to external circuitry.

2. The device defined in claim 1 wherein said body is semiconductor material of one type of conductivity, said base regions comprise zones of semiconductor material formed in said body and of conductivity-type opposite to that of said body, and said emitter electrodes comprise zones of semiconductor material formed in the zones of said base electrodes and of the opposite conductivity type.

3. The device defined in claim 1 wherein said base regions comprise zones of semiconductor material of substantially the same size and shape formed in a surface of said semiconductor body, and said emitter regions comprise zones of semiconductor material of substantially the same size and shape formed in said zones comprising said base electrodes, all of said zones and said body being accessible on said surface of said body.

4. A circuit including integrated semiconductor devices free of avalanche oscillations comprising a plurality of integrated semiconductor devices, each of which represents an operating position in a chain, each semiconductor device including a body of semiconductor material having first and second transistors formed therein, said first and second transistors having substantially identical configurations and characteristics and including base, emitter, and collector regions of semiconductor material, said body comprising a common collector region for both transistors, a first common ohmic electrode connection between said emitter regions of said first and second transistors for connection to an external circuit, a second ohmic electrode connection to the common collector regions of said first and second transistors for connection to an external circuit, a third ohmic connection to one of the base regions of one of said transistors, the base regions of said second transistor remaining without a connection so that it cannot be connected to external circuitry, a plurality of utilization devices, each said second connection to said collector regions of said transistors being coupled to one utilization device, and input signal means coupled to the third ohmic connections to the base regions of each device, whereby an input signal applied to a device causes the device to turn on and operate its associated utilization device.

References Cited

UNITED STATES PATENTS

| | | | |
|---|---|---|---|
| 3,197,710 | 7/1965 | Lin | 330—38 |
| 3,378,695 | 4/1968 | Marette | 307—211 |

JAMES D. KALLAM, Primary Examiner

B. ESTRIN, Assistant Examiner

U.S. Cl. X.R.

307—93, 102, 202, 303, 318; 317—235